United States Patent
Chandrasekar et al.

(10) Patent No.: US 6,706,324 B2
(45) Date of Patent: Mar. 16, 2004

(54) METHOD OF FORMING NANO-CRYSTALLINE STRUCTURES AND PRODUCT FORMED THEREOF

(75) Inventors: Srinivasan Chandrasekar, West Lafayette, IN (US); Walter D. Compton, West Lafayette, IN (US); Thomas N. Farris, West Lafayette, IN (US); Kevin P. Trumble, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 89 days.

(21) Appl. No.: 10/051,626

(22) Filed: Oct. 27, 2001

(65) Prior Publication Data

US 2002/0150496 A1 Oct. 17, 2002

Related U.S. Application Data (60) Provisional application No. 60/244,087, filed on Oct. 28, 2000.

(51) Int. Cl.[7] .............................................. C23C 16/00
(52) U.S. Cl. ................... 427/255.11; 427/216; 427/212; 427/242; 427/271; 427/287; 241/DIG. 14; 75/333; 75/342; 75/954; 51/293
(58) Field of Search .................................. 428/220, 696, 428/698, 699; 427/249, 255.11, 8, 10, 564, 573, 576, 577, 216, 212, 242, 271, 287; 75/333, 342, 954; 241/175; 419/36, 38; 51/293

(56) References Cited

U.S. PATENT DOCUMENTS

| | | | | |
|---|---|---|---|---|
| 3,524,735 A | | 8/1970 | Oetiker | 51/164 |
| 4,129,443 A | | 12/1978 | Kaufman | 75/212 |
| 5,516,588 A | * | 5/1996 | van den Berg et al. | 428/469 |
| 5,590,387 A | | 12/1996 | Schmidt et al. | 419/36 |
| 5,597,401 A | | 1/1997 | Megy | 75/304 |
| 5,939,146 A | * | 8/1999 | Lavernia | 427/446 |
| 6,334,583 B1 | | 1/2002 | Li | 241/175 |

* cited by examiner

*Primary Examiner*—Merrick Dixon
(74) *Attorney, Agent, or Firm*—Simran Trana; Gary M. Hartman; Domenica N.S. Hartman (57) ABSTRACT

A product in which at least a portion of the product has a nanocrystalline microstructure, and a method of forming the product. The method generally entails machining a body in a manner that produces chips consisting entirely of nano-crystals as a result of the machining operation imposing a sufficiently large strain deformation. The body can be formed of a variety of materials, including metal, metal alloy and ceramic materials. Furthermore, the body may have a microstructure that is essentially free of nano-crystals, and may even have a single-crystal microstructure. The chips produced by the machining operation may be in the form of particulates, ribbons, wires, filaments and/or platelets. The chips are then used to form the product. According to one aspect of the invention, the chips are consolidated to form the product, such that the product is a monolithic material that may contain nano-crystals. According to another aspect of the invention, the chips are dispersed in a matrix material, such that the product is a composite material in which the chips serve as a reinforcement material.

41 Claims, 6 Drawing Sheets

α — Rake angle
φ — Shear plane angle
γ — Clearance angle
$t_o$ — Undeformed chip thickness
$t_c$ — Deformed chip thickness
$V_c$ — Cutting velocity

AFM　　　　　　　　　　　　　　Optical Microscope

Figure 10

AFM　　　　Figure 11　　　　Optical Microscope

_US 6,706,324 B2_

METHOD OF FORMING NANO-CRYSTALLINE STRUCTURES AND PRODUCT FORMED THEREOF

CROSS REFERENCE TO RELATED APPLICATIONS

This application claims the benefit of U.S. Provisional Application No. 60/244,087, filed Oct. 28, 2000.

STATEMENT REGARDING FEDERALLY SPONSORED RESEARCH

Not applicable.

BACKGROUND OF THE INVENTION (1) Field of the Invention

The present invention generally relates to methods of producing materials with nanocrystalline microstructures, and more particularly to producing such materials by machining and then using the nanocrystalline material to form a product.

(2) Description of the Related Art

Significant benefits can be gained by deforming metal alloys through the application of very large plastic strains. Principal among these are microstructure refinement and enhanced mechanical and physical properties. Of particular current interest is the use of "severe" plastic deformation (SPD) to produce bulk solids with ultra-fine grained microstructures (UFGS), especially nanocrystalline structures (NS) characterized by their atoms arranged in crystals with a nominal dimension of less than one micrometer. Nanocrystalline solids have become of interest because they appear to have significant ductility, formability and resistance to crack propagation, and possess interesting chemical, optical, magnetic and electrical properties. Nanocrystalline solids also appear to respond to radiation and mechanical stress quite differently than microcrystalline materials (crystals with a nominal dimension of one micrometer to less than one millimeter), and their response can be varied by changing the crystal size. Materials made by consolidating nanocrystalline powders have also been shown to have enhanced attributes not typically found in conventional materials. As a result, nanocrystalline materials are believed to have significant potential for use in industrial applications, provided they can be manufactured in a cost-effective manner.

Multi-stage deformation processing is one of the most widely used experimental approaches to studying microstructural changes produced by very large strain deformation. Notable examples include such techniques as rolling, drawing and equal channel angular extrusion (ECAE). In this approach, very large plastic strains (true plastic strains of four or more) are imposed in a specimen by the cumulative application of deformation in multiple stages, the effective strain in each stage of deformation being on the order of one. The formation of micro- and nanocrystalline structures has been demonstrated in a variety of ductile metals and alloys using multi-stage deformation processing. However, there are significant limitations and disadvantages with this processing technique. A significant limitation is the inability to induce large strains in very strong materials, such as tool steels. Other limitations include the inability to impose a strain of much greater than one in a single stage of deformation, the considerable uncertainty of the deformation field, and the minimal control over the important variables of the deformation field—such as strain, temperature, strain rate and phase transformations—that are expected to have a major influence on the evolution of microstructure and material properties.

The most widely used technique for synthesizing nanocrystalline metals has been by condensation of metal atoms from the vapor phase. In this technique, the metal is evaporated by heating and the evaporated atoms then cooled by exposure to an inert gas such as helium or argon to prevent chemical reactions, thereby enabling the purity of the metal to be maintained. The cooled atoms condense into single-crystal clusters with sizes typically in the range of 1 to 200 nm. The production of ceramic nanocrystals is similar, except that evaporated metal atoms are made to react with an appropriate gas, e.g., oxygen in the case of oxide ceramics, before they are allowed to condense. The resulting crystals may be compacted and sintered to form an article, often at a sintering temperature lower than that required for a microcrystalline powder of the same material. While suitable for making powders and small compacted samples with excellent control over particle size, the condensation method is at present not practical for most applications other than experimental. A particularly limiting aspect of the condensation method is the inability to form nanocrystalline materials of alloys because of the difficulty of controlling the composition of the material from the vapor phase. Another limiting aspect of the condensation method is that high green densities are much harder to achieve as a result of the nano-size particles produced. Other methods that have been explored to synthesize nanocrystals include aerosol, sol-gel, high-energy ball-milling, and hydrothermal processes. However, these techniques cannot produce nanocrystalline materials at a cost acceptable for practical applications.

From the above, it can be seen that it would be desirable if a more controllable and preferably low-cost approach were available for synthesizing nanocrystalline solids for use in the manufacture of products. It would be particularly desirably if such an approach were capable of producing nanocrystalline solids of a wide variety of materials, including very hard materials and alloys that are difficult or impossible to process using prior art techniques.

BRIEF SUMMARY OF THE INVENTION

The present invention provides a product in which at least a portion of the product has a nanocrystalline microstructure, and a method of forming the product. The method generally entails machining a body in a manner that produces chips consisting entirely of nano-crystals as a result of the machining operation being performed in a manner that imposes a sufficiently large strain deformation. The body can be formed of a variety of materials, including metals, metal alloys, and ceramic materials. Furthermore, the body may have a microstructure that is essentially free of nano-crystals, and may even have a single-crystal microstructure. The chips produced by the machining operation may be in the form of particulates, ribbons, wires, filaments and/or platelets. The chips are then used to form the product. According to one aspect of the invention, the chips are consolidated (with or without comminution) to form the product, such that the product is essentially a monolithic material consisting essentially or entirely of nano-crystals, or of grains grown from nano-crystals. According to another aspect of the invention, the chips are dispersed in a matrix material, such that the product is a composite material in which the chips are dispersed as a reinforcement material.

The above features of the invention are based on the determination that nanocrystalline structures can be formed in materials by machining under appropriate conditions to produce very large strain deformation, including high strain rates, such as a plastic strain of about 0.5 to about 10 and a strain rate of up to $10^6$ per second. Machining processes believed to be capable of producing suitable nanocrystalline structures include cutting and abrasion techniques. Cutting speed does not appear to be determinative, such that essentially any cutting speed can be used if a cutting tool is used to perform the machining operation. Because the production method for the chips is a machining operation whose parameters can be precisely controlled, the desired nanocrystalline microstructure for the chips can be accurately and repeatably obtained for a given body material. Furthermore, the machining operation can be adjusted to produce chips of various grain sizes and macroscopic shapes for use in a variety of application. The production of nanocrystalline chips can often be achieved with this invention without having any negative impact on the article being machined, such that nanocrystalline chips can be produced as a useful byproduct of an existing manufacturing operation. If the byproduct of such a manufacturing operation, it is notable that the chips produced and utilized by this invention would previously have been viewed as scrap produced by the operation, and therefore simply discarded or melted for recycling.

In view of the above, the present invention provides a controllable and low-cost method for synthesizing nanocrystalline solids that can be used to produce monolithic and composite products. The method of this invention also makes possible the capability of producing nanocrystalline solids from materials that have been difficult or impossible to process using prior art techniques, such as very hard materials that cannot be processed by multi-stage deformation processes, and alloys that cannot be processed by the condensation method.

Other objects and advantages of this invention will be better appreciated from the following detailed description.

DETAILED DESCRIPTION OF THE INVENTION

An investigation leading to this invention was undertaken to determine the microstructure and mechanical properties of chips produced by machining steels, and to explore the conditions under which they are produced. Steel cylinders of AISI 52100, 4340 and M2 tool steel having diameters of about 15.7 mm were heat-treated by through-hardening and tempering to hardness values of about 60 to 62 $R_c$, about 56 to 57 $R_c$, and about 60 to 62 $R_c$, respectively. The initial microstructures of the steels prior to machining were tempered martensite. The compositions (in weight percent), austenitization temperatures ($A_{C3}$) and approximate grain size (GS) of the steel specimens are summarized in Table 1 below.

TABLE 1

| | Steel Type (AISI) | | |
|---|---|---|---|
| | 4340 | 52100 | M2 |
| C | 0.38–0.43 | 1.00 | 0.8 |
| Mn | 0.6–0.8 | 0.31 | 0.35 |
| Si | 0.15–0.3 | 0.26 | 0.35 |
| Cr | 0.7–0.9 | 1.45 | 4.52 |
| Ni | 1.65–2.00 | 0.14 | 0.2 |
| Mo | 0.2–0.3 | 0.04 | 5.39 |
| P | 0.035 max | 0.009 max | 0.027 max |
| S | 0.040 max | 0.019 max | 0.005 max |
| V | — | — | 2.09 |
| Cu | — | 0.09 | 0.13 |
| Al | — | — | 0.02 |
| Co | — | — | 0.39 |
| W | — | — | 6.86 |
| Fe | balance | balance | balance |
| $A_{C3}$ (° C.) | 815–845 | 775–800 | 1190–1230 |
| GS (μm) | 7 | 5 | 5 |

Notably, M2 has a significantly higher austenitization temperature ($A_{C3}$ of about 1200° C.) than the 52100 and 4340 steels ($A_{C3}$ of about 800° C.). The cylinders were machined using a high precision lathe with polycrystalline cubic boron nitride (CBN) cutting tools. Under certain conditions, including a cutting speed of about 50 to 200 m/min, a depth of cut of about 0.1 to 0.2 mm, and a tool feed rate of at least 0.05 mm/rev, the so-called white layer (WL) was observed in the machined surfaces of the 51200 and 4340 steels, though not in any of the M2 steel specimens. As known in the art, white layers are thin (typically less than 50 μm thick) hard layers that can form in the surfaces and chips of certain steels when subjected to machining, abrasion or sliding at high velocities. White layers resist chemical etching and appear featureless under an optical microscope, hence the term "white layer."

The chips produced under the above conditions were analyzed using optical microscopy, X-ray diffraction, transmission electron microscopy (TEM), and nano-indentation to establish their structure, composition and mechanical properties. The nano-hardnesses of the chips were estimated by making indentations of sub-micron depth using a Berkovitch indenter (three-faced diamond pyramid) on a nano-hardness tester (Nanoindenter XP). The indenter penetration depth was typically set at about 200 nm, which typically corresponded to a load of about 10 mN. This penetration depth was substantially less than the size (on the order of up to about 0.1 mm) of the chips being analyzed. From measurements of the load-penetration curve during indentation and subsequent unloading, both hardness and Young's modulus of the chips were estimated. Electron transparent samples of particles taken from chips were observed by TEM to determine their structures (e.g., crystalline or amorphous) and grain size. For this purpose, the chips were gently broken into smaller particles using a mortar and pestle, which were then separated by ultrasonic agitation in methanol. The particles were then placed on a grid and observed under the TEM. Some of the particles or regions of these particles were electron transparent, allowing direct images and diffraction patterns of these areas to be obtained. The diffraction patterns were used to establish the crystallinity of the particles, while a combination of the bright field image and diffraction was used to determine grain size.

At this point, it is worth noting that both the chips and the machined surface of each specimen were subjected to very large strain deformation during machining. The deformation that occurs in the shear plane of a chip can be seen in reference to FIG. 1, which represents the machining of a workpiece surface with a wedge-shaped indenter (tool) as done in the investigation. The material being removed by large strain deformation, namely, the chip, slides over the surface of the tool known as the rake face. The angle between the rake face of the tool and the normal to the work surface is known as the rake angle ($\alpha$). The edge of the wedge penetrating the workpiece is the cutting edge. The amount of interference between the tool and the workpiece is the undeformed chip thickness depth of cut ($t_0$) and the relative velocity between the tool and the workpiece is the cutting velocity ($V_c$). When the tool cutting edge is perpendicular to the cutting velocity and the width of cut is small compared to the cutting edge length and $t_0$, a state of plane strain deformation prevails, which is believed to be a preferred configuration for experimental and theoretical investigations of machining.

Figure 1:
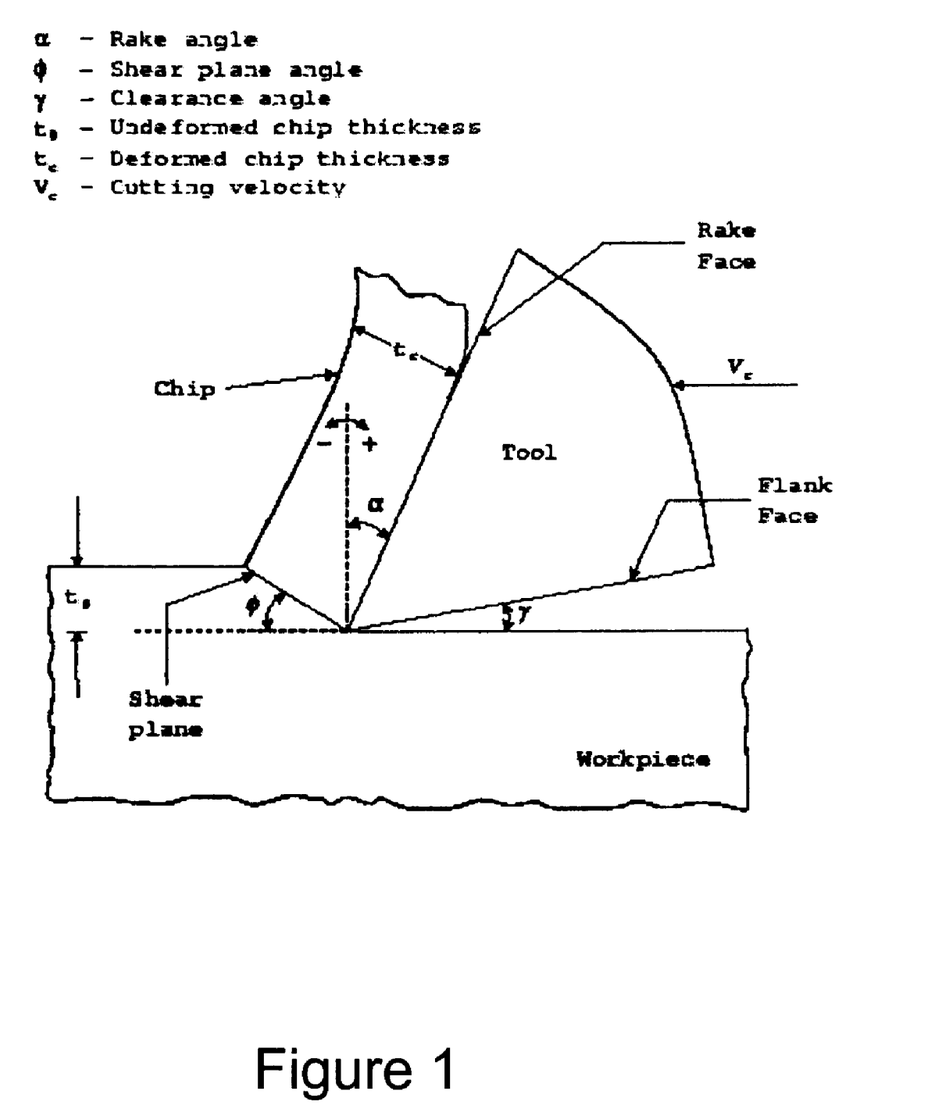
FIG. 1 schematically represents the process of machining a body with a cutting tool to produce nanocrystalline chips in accordance with one aspect of this invention.

The chip formation in FIG. 1 is seen to occur by concentrated shear along a plane called the shear plane, where a shear strain ($\gamma$) is imposed during chip formation. The shear strain can be estimated by Equation (1) below:

$$\gamma = \cos\alpha / \sin\phi \cos(\phi - \alpha) \quad \text{(Eq. 1)}$$

where the shear plane angle ($\phi$) is a known function of $t_0$ and $t_c$. The effective Von Mises strain ($\epsilon$) can be predicted using $$\epsilon = \gamma/(3)^{1/2} \quad \text{(Eq. 2)}$$

Equation (1) shows that the shear strain ($\gamma$) can be varied over a wide range by varying the rake angle ($\alpha$) from large positive to large negative values (see FIG. 1). Additionally, the friction at the tool-chip interface also affects shear strain ($\gamma$) via its effect on the shear plane angle $\phi$.

In view of the above, and as reported in the literature, effective plastic strains in the range about 0.5 to about 10 and strain rates of up to $10^6$ per second can be generated with appropriate machining conditions, as can a wide range of shear plane temperatures. These ranges of values are substantially greater than can be realized in typical severe plastic deformation processes. Geometric parameters of machining like depth of cut ($t_0$), rake angle ($\alpha$) and cutting velocity ($V_c$) affect the shear deformation in a manner analogous to the action of dies in forging or extrusion. The effective plastic strain along the shear plane (deformation zone) in the chip can be systematically varied in the range of about 0.5 to about 10 by changing the tool rake angle, and to a lesser extent by changing the friction between tool and chip. The mean shear and normal stresses on the shear plane can be varied by changing the tool geometric parameters together with process parameters such as $V_c$ and $t_0$, while the values of these stresses can be obtained from measurement of the forces. Finally, the temperature in the deformation zone can be systematically varied by changing the cutting velocity. For example, by cutting at very low velocities (about 0.5 mm/s), the temperature can be kept marginally above the ambient temperature while achieving very large strain deformation. Alternatively, temperatures where phase transformations (e.g., martensitic, melting) may be expected to occur in the chip can be realized by increasing the cutting velocity to higher values, for example, about 1 to about 2 m/s. The ability to change the friction along the tool-chip interface by a factor of up to three has also been demonstrated using a combination of tool coatings, low-frequency modulation of the tool-chip interface and lubrication which assures that lubricant is always present at the interface between the tool and the chip. The extent to which friction (as well as the other parameters and conditions discussed above) can be controlled in a machining operation is not possible in other severe plastic deformation processes. In summary, the temperature, stress, strain, strain rate and velocity fields in the zone of deformation can be well estimated using available mechanics models or obtained by direct measurement. Thus, very large strain deformation conditions can be imposed and varied systematically over a wide range, a range over and beyond that currently obtainable in other severe plastic deformation processes.

In the investigation of the AISI 52100, 4340 and M2 steels, the normal and shear stresses imposed on the shear plane and on the work surface of each specimen was estimated to be about 2 to 4 GPa. The temperature rise of the chips was concluded to be typically greater than that of the machined surface, since the relatively large mass of the machined surface was capable of conducting away most of the frictional heat generated on the tool rake face as well as the heat generated in the primary deformation zone (shear plane) due to plastic flow. The cooling rates in the chip and the workpiece were quite high, estimated as at least $0.5 \times 10^{5\circ}$ C./s.

Table 2 summarizes the results of the nano-hardness measurements made in the chips of the 52100 specimens and in the bulk of the 52100 specimens.

TABLE 2

|  | Hardness (GPa) | Hardness Range (GPa) | Young's Modulus (GPa) |
| --- | --- | --- | --- |
| Chip | 12.85 ± 0.80 | 11.5 – 16.2 | 235 ± 8 |
| Bulk | 10.70 ± 0.85 | 9.0 – 12.0 | 235 ± 16 |

The chip hardness value can be seen to be about 25% higher than, and statistically distinguishable from, the nano-hardness value obtained for the bulk 52100 steel. Furthermore, the chip hardness is significantly higher than Knoop hardness values reported for untempered martensite produced by quenching 52100 steel specimens. This difference is significant, even accounting for the fact that hardness measurements made at sub-micron penetration depths generally yield slightly higher hardness values than Knoop hardness measurements. The Young's moduli of the chip and the bulk material, obtained by indentation, were virtually indistinguishable from that of the bulk material and close to the commonly quoted modulus value of 220 GPa for steels.

Figure 2:
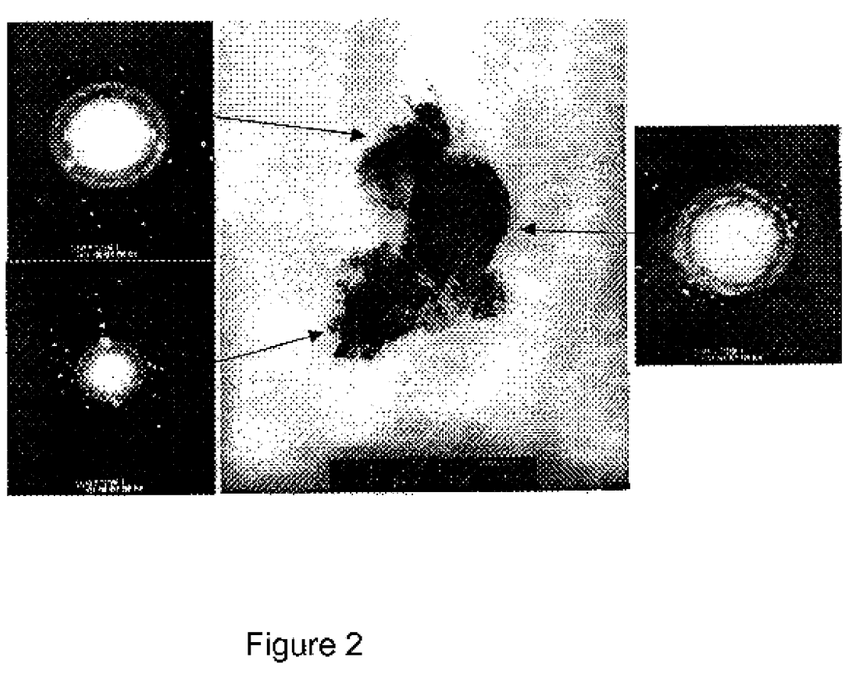
FIG. 2 is a transmission electron microscopy (TEM) image of an electron-transparent particle from a 52100 steel chip, and three electron diffraction patterns obtained from different regions of the particle, which evidence that each of the corresponding regions in the image is a distinct single crystal having a grain size of about 50 nm to about 300 nm.

FIG. 2 is a TEM image of an electron-transparent particle from one of the 52100 steel chips. Also shown in FIG. 2 are three electron diffraction patterns obtained from different regions of the particle. The diffraction patterns indicate that each of the corresponding regions in the image is a distinct single crystal, indicating that the particle is polycrystalline. Furthermore, from the TEM image of each of the single crystal regions, it is seen that the crystal (or grain) size is in the range of about 50 mn to about 300 nm. Analysis of TEM images of other chip particles from each of the 4340, 52100, and M2 steels also showed the chips to be polycrystalline with a grain size typically in the range of about 30 to about 300 nm. All of the chips produced under machining conditions that include a cutting speed of about 100 to 200 m/min, a depth of cut of about 0.1 to 0.2 mm, and a tool feed rate of at least 0.05 mm/rev, were shown to contain nanocrystalline structures (NS). Furthermore, the nano-scale grain sizes of the chips were considerably smaller than the five to seven micrometer grain sizes reported above for the heat-treated steel specimens prior to machining. Consequently, it was apparent that the tempered martensite initially present in the steel specimens had undergone a modification/transformation during machining. This conclusion is consistent also with the comparative nano-hardness results discussed above for the chips and the bulks of the steel specimens.

In research subsequent to the above investigation, it was concluded that the formation of nanocrystalline structures in machining processes appears to be a general phenomenon that goes beyond steels and beyond machining with wedge-shaped tools. For example, measurements of the nano-hardness of chips in 4340 steel produced by grinding showed the layers to have hardness values of about 12 to about 13 GPa, which was substantially greater than the hardness of the initial pearlite microstructures of the specimens. Microstructure analysis showed these chips to have characteristics very similar to those of the chips described above. A preliminary TEM analysis of chips produced by grinding titanium, copper, single-crystal iron and M50 steel at a wheel velocity of 33 m/s also showed the resulting chips to be composed of nanocrystalline structures. In yet another investigation, nano-indentation of brass chips produced by machining showed their hardnesses to be about 50 to about 75 percent greater than that of the brass material prior to machining, suggesting that these chips too may be composed of NS. These observations suggest that a very large strain deformation that occurs during material removal under appropriate conditions may be the principal driving force for NS formation.

Based on the above investigations, it was concluded that machining at cutting speeds of about 100 to about 200 m/min consistently generated nanocrystalline structures in 52100, 4340 and M2 steels if a sufficiently large strain deformation occurred. It is useful to consider other the conditions that may influence the formation of a nanocrystalline structure in steels, based on an analysis of their formation in machining and grinding. During machining, the zone of NS formation is subject to large strain deformation, localized high temperature, high quenching rates, and possibly an austenite-martensite phase transformation. Some of these conditions may influence the generation of the NS seen in this investigation. However, except for large strain deformation, these other conditions can be readily achieved in conventional heat-treatment of steels. For example, the austenite-martensite transformation, induced by rapid quenching, is a key element in heat treatment. However, there are no reports of NS in steels modified by heat treatment. Hardness values of martensite formed by heat treatment are also substantially lower than those of NS produced by high-velocity deformation in similar types of steels. These observations suggest that while temperature-time histories and phase transformations may be important in determining the range of grain sizes, physical properties and hardness of the NS, the conditions that generate very large strain deformation appear to be essential for NS formation. This surmise is reinforced by observations of NS in the non-ferrous metals described above, none of which undergo a displacive transformation. That large strain deformation can result in very fine grain sizes is demonstrated by observations of microstructure in macroscopic metal samples subjected to such deformation.

In another investigation, chips were formed by machining oxygen-free high conductivity (OFHC) copper, commercially pure iron and 1018 steel. The initial grains sizes for the specimens were about 170, 55 and 70 micrometers, respectively. The machining conditions used for these materials included a depth of cut of about 2.54 mm and a tool feed rate of about 0.21 mm/rev. For the copper specimens, a cutting speed of about 28.8 m/minute was used, while a cutting speed of about 6.375 m/minute was used for the iron and 1018 specimens. Typical thicknesses for the resulting chips were about 200 to about 1000 $\mu$m. The chips were prepared by metallographic polishing for subsequent hardness and microstructure analysis. Hardness measurements were done using Vickers indentation so as to obtain accurate measurements of the bulk hardness of the chips, devoid of surface-related contributions. The indent size was kept to at least five times smaller than the dimensions of the chip sample to ensure accuracy in the hardness measurements. Metallographically polished chip samples were also etched for analysis of grain size, flow patterns and the presence of sub-structures within grains. Observations of these chips were made using SEM, AFM, TEM and optical microscopy.

A parallel series of studies was made on bulk samples of the materials so as to have an assessment of their hardness and microstructure prior to machining. The bulk samples were generally in a work-hardened state prior to machining because they had been produced by drawing or extrusion processes. For reference, the bulk as well as chip samples of some specimens were annealed and hardness measurements repeated so that a true measure of the hardness changes caused by machining could be obtained. For this purpose, a series of annealing experiments were performed on the copper, iron, and 1018 steel chips to obtain an understanding of the recrystallization behavior of these chip samples. The recrystallization experiments were performed in a controlled argon atmosphere furnace using different time-temperature cycles. Hardness and grain-size analysis of these samples were performed in accordance with the investigation described above for the 4340, 52100 and M2 steels.

Table 3 is a summary of the Vickers hardness measurements, from which it is evident that for both the copper and iron specimens, the hardness of the chips was substantially greater than that of the material prior to machining as well as that of the annealed samples.

TABLE 3

| | Vickers Hardness (kg/mm$^2$) | | |
| --- | --- | --- | --- |
| Processing Condition: | Base | Chip | Annealed Base |
| Copper | 93 | 143 | 67 |
| Iron | 125 | 290 | 86 |
| 1018 steel | 230 | 300 | 209 |

Hardness measurements made at different locations over the entire chip volume showed that the hardness distribution was essentially uniform. A study of the hardness distribution in partially formed chips produced in a specially devised experiment showed that the hardness increased sharply when going from the bulk material into the chip as the shear plane is traversed.

Figure 3:
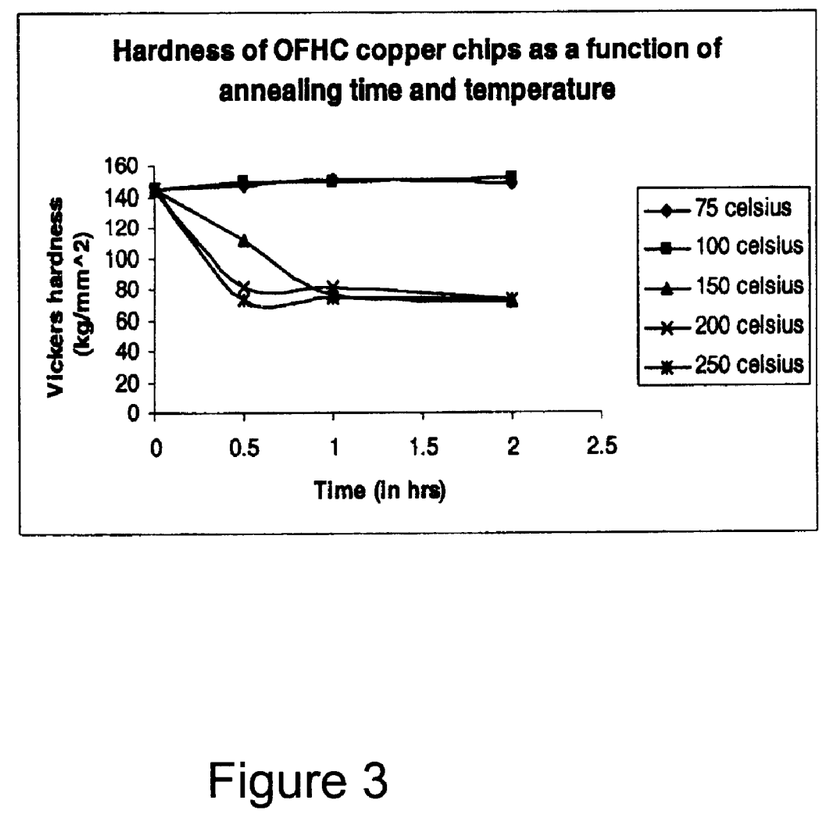
FIG. 3 is a graph showing the effect that annealing has on copper chips produced by machining to have nanocrystalline structures in accordance with this invention.

FIG. 3 shows the results of recrystallization experiments on some of the copper chips, and evidences that there was a critical temperature of about 100° C. below which there was no degradation in hardness values even for annealing times of six hours. This suggests that the mechanical properties of the chips can be retained through certain thermal processing cycles. Preliminary results from annealing experiments on iron and 1018 steel have suggested a similar recrystallization behavior at significantly higher temperatures. The hardness of the copper, iron and 1018 steel chips was shown to be retained at room temperature even after about one thousand hours, though small changes in the microstructures of the copper chips were observed after extended periods at room temperature.

Figure 4:
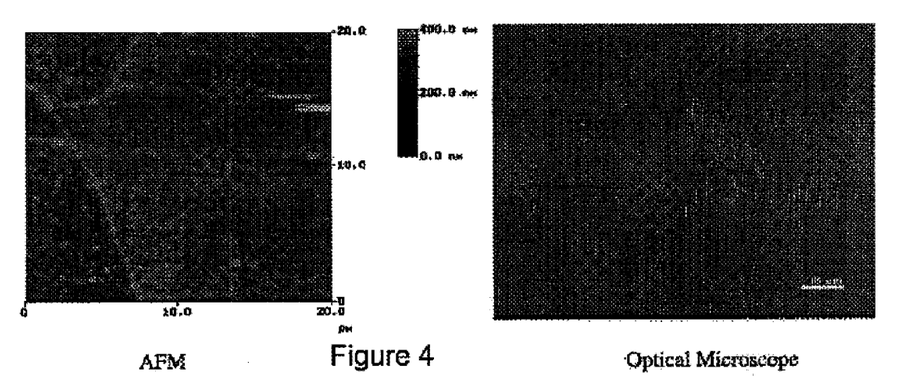
FIGS. 4 through 6 are atomic force microscope (AFM) and optical microscope images of iron, copper and steel specimens, respectively, prior to machining.
Figure 5:
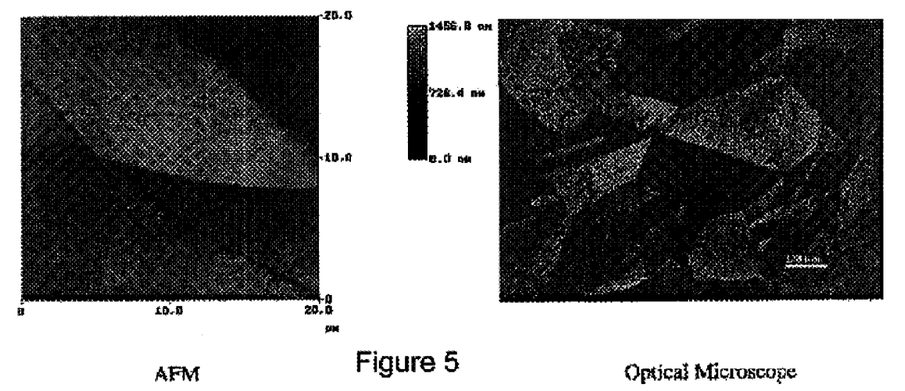
Figure 6:
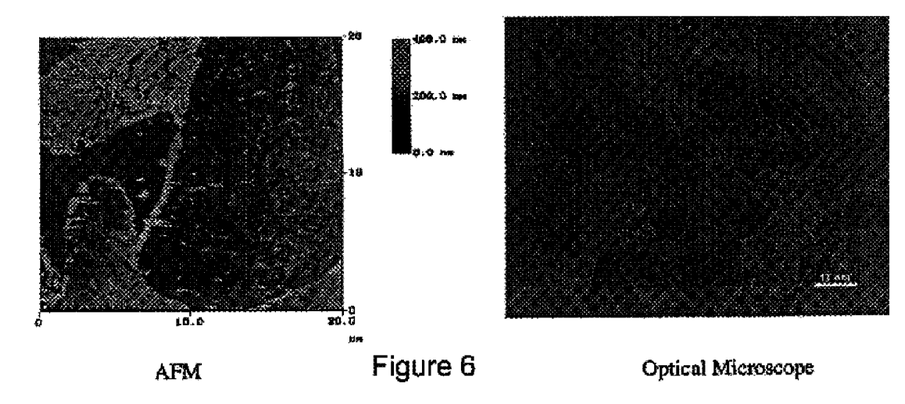
Figure 7:
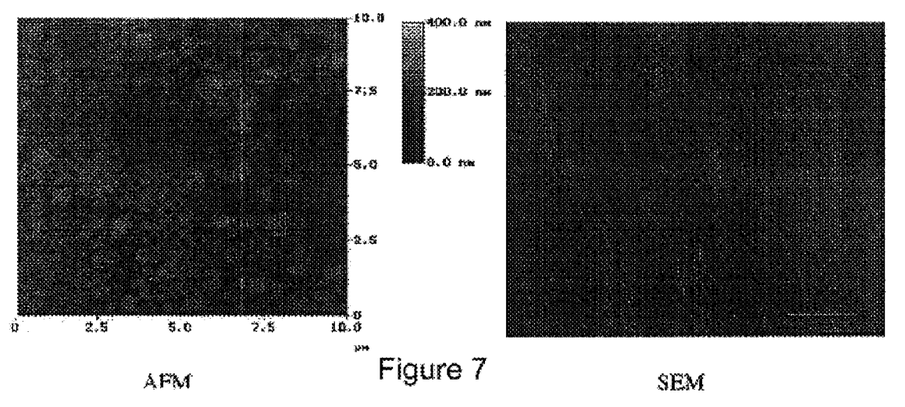
FIGS. 7 through 9 are AFM and optical microscope images of the same specimens showing nanocrystalline structures as a result of being machined in accordance with this invention.
Figure 8:
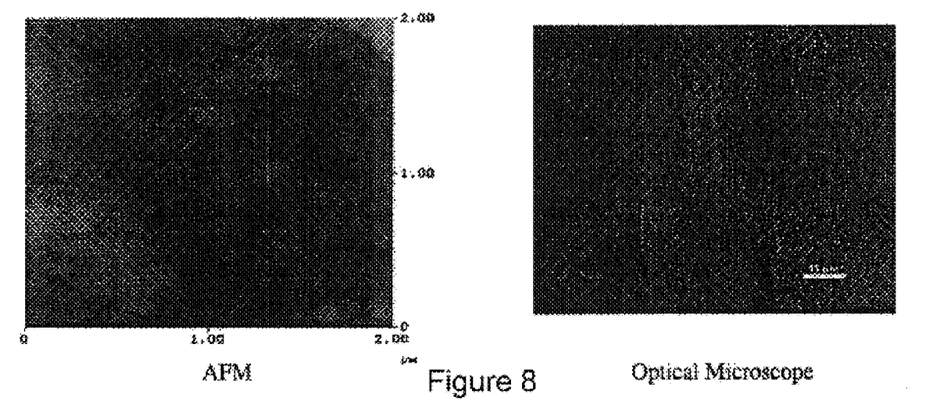
Figure 9:
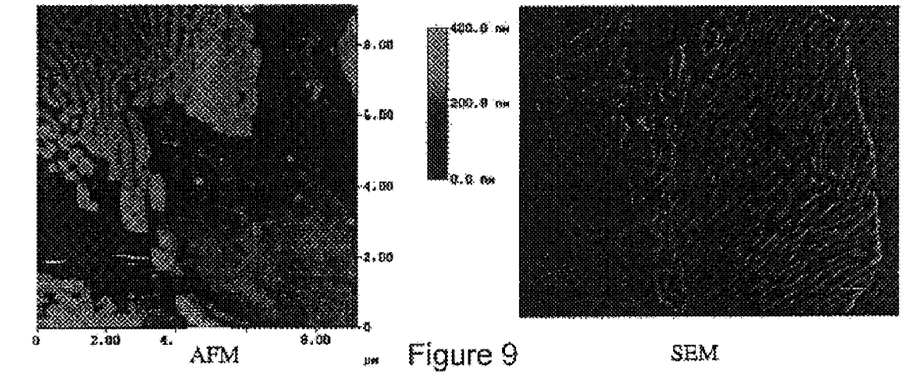
Figure 10:
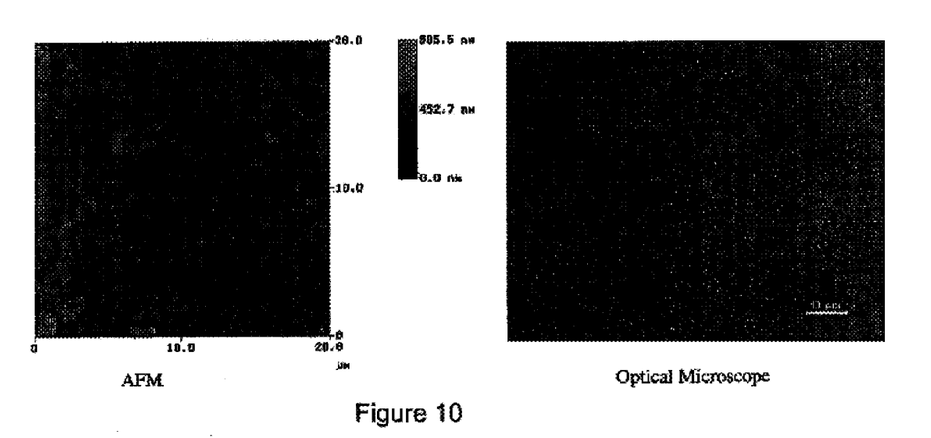
FIGS. 10 and 11 are AFM and optical microscope images of copper and iron specimens, respectively, machined in accordance with this invention to contain nanocrystalline structures, and subsequently annealed to cause grain growth.
Figure 11:
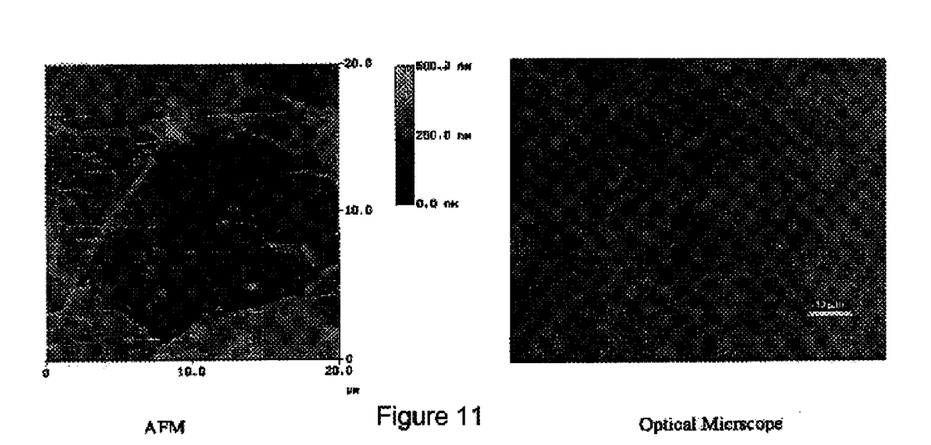

Finally, the examination of optical microscope, AFM, SEM and TEM images of bulk workpiece materials, chips, and recrystallized chips evidenced that, while the bulk specimens had relatively large grains prior to machining (ranging from about 55 to about 170 μm), the only structures resolved in the chips were sub-structures with dimensions in the range of about 100 to 500 μm. FIGS. 4 through 6 are AFM and optical microscope images of iron, copper and 1018 steel specimens, respectively, prior to machining, while FIGS. 7 through 9 are AFM and optical microscope images of chips produced by machining the iron, copper and 1018 steel specimens, respectively. Finally, FIGS. 10 and 11 are AFM and optical microscope images of a copper chip annealed at about 150° C. for about two hours, and an iron chip annealed at about 600° C. for about thirty minutes. FIGS. 10 and 11 evidence the occurrence of grain growth, with the formation of grains on the order of about 1 to about 10 μm, in the recrystallized chips.

The series of investigations described above suggested the existence of the conditions under which nanocrystalline structures can be formed by very large strain deformation in other ferrous and nonferrous metals and alloys, such as titanium, aluminum, tungsten and their alloys. For example, subsequent to the above investigations, nanocrystalline structures with grain sizes of about 100 to 300 nm were produced in annealed iron and single-crystal tungsten by very large strain deformation. It was therefore concluded that a variety of materials can be machined at various cutting speeds to consistently produce chips having grain sizes of about 30 to 500 nm, and likely below 300 and 100 nm, if machining conditions impose very large strain deformations. Appropriate machining conditions will typically differ for different materials, but can be readily determined by experimentation and verified by the presence of nanocrystalline grains. Because of the ability to independently control a number of different machining conditions, it may be possible to tailor a machining operation to produce chips with a desired grain size range. During the investigations, it was also observed that chips with NS can be produced in varying shapes and sizes. Typical chip forms that have or could be produced include platelets, particulates, ribbons, helixes, wires, and tangled coils, obtained by machining with a tool. While the formation of the chip involves shearing of the work material to very large strains in the narrow zone of the shear plane, the longitudinal and cross-sectional shape of the chip is controlled primarily by the machining conditions (e.g., feed and depth of cut) and the geometrical parameters of the tool. For example, by using grooves on the tool rake face, the chip can be curled into a helix. Therefore, it is feasible to produce high-strength, nanocrystalline chips with a wide variety of macroscopic shapes. Such chips can be consolidated (with or without comminution) and sintered to produce a monolithic article, or used as continuous and/or discontinuous reinforcements for a variety of matrix materials, including polymers, metals and ceramics. The possibility of making low-cost continuous nanocrystalline reinforcements of different shapes by machining in accordance with this invention provides for the engineering of new materials.

From the above investigations, it was also concluded that it is very likely that ceramic and intermetallic materials can be machined by cutting or abrasion to form chips composed entirely of nanocrystalline structures, provided sufficiently sharp tools are used to form the chips. Under such conditions, large-strain plastic flow can be expected to occur, and was observed in ceramic chips in the form of stringy, ribbon-like chips produced by abrading MgO ceramic and soda-lime glass. These chips showed characteristics very similar to those formed by plastic cutting of ductile metals. High velocity deformation can be expected to occur when cutting brittle solids such as ceramics and glasses with a sharp tool, because of the imposition of significant hydrostatic compression in the zone of chip formation, together with the occurrence of high temperatures. It is believed that machining with sharp, single-crystal or poly-crystal diamond tools at high cutting speeds would achieve plastic cutting in brittle solids to create fine particulate or platelet-like chips composed of NS, as would high speed grinding with diamond abrasive wheels of fine grit sizes at velocities of 30 to 100 m/s. Under such conditions, the chips are likely to be subjected to intense deformation and high temperatures because of the high cutting speeds involved and the imposition of extremely high pressure and shear at the abrasive-chip interface.

While nanocrystalline structures have been previously shown to exhibit unique intrinsic property combinations, achieving these property combinations in bulk materials has been hampered by the high cost of nanocrystalline structures, i.e., those produced by condensation methods. As discussed previously, nanocrystalline structures produced by condensation methods are also essentially limited to nano-sized particles of pure metals or ceramics, with the ultra-fine particle sizes limiting the green densities that can be achieved by consolidation. However, the present invention makes possible a source of polycrystalline materials with nano-sized grains, and can be produced at relatively low cost, particularly since the invention has evidenced that chips with nanocrystalline structures can be produced without compromising the quality of the machined workpiece. As a result, the present invention makes possible a wide range of applications for low-cost monolithic and composite materials containing nanocrystalline structures. Comminution, (e.g., ball, attrition, jet milling, etc.) of chips with nanocrystalline structures enables large-scale production of polycrystalline particulates that can be consolidated and densified into bulk monolithic materials more readily than nano-sized particles produced by condensation. Densification during sintering can be further promoted because nanocrystalline materials often exhibit enhanced sintering kinetics due to high concentrations of crystal defects, allowing for the use of lower sintering temperatures. Though thermal processing may lead to coarsening (e.g., recrystallization and grain growth, as shown in FIGS. 10 and 11), the benefits of enhanced processing (lower sintering temperatures, higher densities, etc.) may outweigh the coarsening effects in monolithic materials for numerous applications. The defect structures of nanocrystalline particulate produced by machining may also enable new deformation processing routes to monolithic materials (e.g., metal injection molding or tape casting), even for intrinsically brittle ceramics such as silicon nitride. In addition, special magnetic properties may be achieved in electrical sheet steel produced from nanocrystalline chips, such as improved performance in transformer cores.

Continuous ribbons and wires of high-strength nanocrystalline chips can be used as reinforcement in composite articles and structures, including concrete for runways, highways and tunnels that are currently reinforced with steel wires. Alternatively, long chips can be broken to produce specific shapes and sizes of reinforcements. For example, platelets that can be produced by controlled breakage of ribbon chips may provide the most efficient stiffening of all discontinuous reinforcement shapes. A preliminary investigation was conducted in which nanocrystalline chips of M2 steel were broken to form platelets that were then incorporated in a bronze matrix by spontaneous (pressureless) melt infiltration, without apparent chemical interaction. Infiltration of an aluminum alloy (Al 356) matrix around identically-formed M2 chips was also successfully achieved. Characterization of the mechanical properties or the Al-M2 composite was done by making sixty nano-indents at various locations in the composite, from which the hardness and Young's modulus histograms were obtained. Three different property clusters corresponding to indents lying in the Al matrix, the M2 reinforcement and the Al-M2 interface region were identified in the hardness and Young's modulus histograms. The hardness and modulus values were, respectively, 0.8–1 GPa and 70–90 GPa for the Al matrix, 1–4.5 GPa and 100–140 GPa in the interface region, and 8–13 GPa and 180–235 GPa in the M2 steel reinforcements. Preliminary assessment of the mean hardness and modulus values for this composite has indicated that these are not significantly different from those of a commercially available Al-SiC composite. No visible cracking or reinforcement pull-out was observed around indentations made near the Al-M2 interfaces. These observations are promising for the incorporation of nanocrystalline platelets, continuous ribbons, filaments, and particulate reinforcements into a variety of metal matrices, including lightweight metal matrix materials such as aluminum and magnesium, which is of interest in a number of commercial ground-transportation and aerospace applications, such as drive shafts, brake disks, and suspension components, where weight reduction is critical. The use of metallic nanocrystalline reinforcements can be expected to offer significantly improved wetting for liquid state processing of conventional reinforcement materials, such as SiC.

Infiltration processing is just one of several feasible routes available to produce composites using the NS reinforcements. Other processes include stir-casting, sintering and extrusion. One of the key issues is the annealing behavior of nanocrystalline reinforcements during composite processing. In this regard, secondary hardening tool and bearing steels such as M2 exhibit their peak hardening response in the melting range of aluminum and magnesium alloys, providing opportunities to improve reinforcement properties during processing of the composite. The incorporation of nanocrystalline chips in polymer matrices by impregnation processing is viewed as being practical since polymer curing temperatures are relatively low, such that essentially no reinforcement annealing effects would be expected.

While the invention has been described in terms of particular embodiments, it is apparent that other forms could be adopted by one skilled in the art. Accordingly, the scope of the invention is to be limited only by the following claims.

What is claimed is:

1. A method of forming a product, the method comprising the steps of:
    machining a body with a microstructure essentially free of nano-crystals to produce polycrystalline chips that are at least micrometer-sized and have nanocrystalline microstructures as a result of a sufficient strain deformation during machining, the polycrystalline chips being in the form of particulates, ribbons, wires, filaments and/or platelets;
    breaking the polycrystalline chips to form polycrystalline particles having nanocrystalline microstructures; and then
    forming a product with the polycrystalline particles by consolidating the polycrystalline particles or dispersing the polycrystalline particles in a matrix material while retaining the nanocrystalline microstructures of the polycrystalline particles.

2. A method according to claim 1, wherein the body has a single-crystal or polycrystalline microstructure.

3. A method according to claim 1, wherein the body is formed of a material chosen from the group consisting of metal, metal alloy and intermetallic materials.

4. A method according to claim 1, wherein the body is formed of an inorganic material chosen from the group consisting of ceramic materials.

5. A method according to claim 1, wherein the polycrystalline chips have grains having at least one dimension of less than 500 nm.

6. A method according to claim 1, wherein the polycrystalline chips have grains having at least one dimension of less than 100 nm.

7. A method according to claim 1, wherein the machining step is performed with a wedge-shaped cutting tool.

8. A method according to claim 1, wherein the machining step is performed with an abrasive grinding tool.

9. A method according to claim 1, wherein the strain deformation that occurs during the machining step is characterized by a plastic strain of about 0.5 to about 10, and a strain rate of up to $10^6$ per second.

10. A method according to claim 1, wherein the breaking step comprises comminuting the polycrystalline chips to form the polycrystalline particles, and wherein the forming step comprises consolidating the polycrystalline particles to form a preliminary product, and then densifying the preliminary product to form the product.

11. A method according to claim 10, wherein the comminuting, consolidation and/or densifying steps cause grain growth in the polycrystalline particles or the product.

12. A method according to claim 1, wherein the product contains the polycrystalline particles dispersed in the matrix material as a result of the forming step.

13. A method according to claim 12, wherein the polycrystalline particles are present in the matrix material in the form of ribbons, wires or filaments.

14. A method according to claim 12, wherein the polycrystalline chips are in the form of ribbons, wires or filaments as a result of the forming step, the breaking step comprising breaking the polycrystalline chips to form platelets prior to dispersing the polycrystalline particles in the matrix material.

15. A method according to claim 12, wherein the matrix material is chosen from the group consisting of metal, metal alloy and intermetallic materials.

16. A method according to claim 12, wherein the matrix material is a polymeric material.

17. A method according to claim 12, wherein the matrix material is an inorganic material chosen from the group consisting of ceramic materials.

18. A method of forming a product, the method comprising the steps of:
    providing a body with a single-crystal or polycrystalline microstructure that is essentially free of nano-crystals;
    machining the body with a wedge-shaped cutting tool to produce polycrystalline chips that are at least micrometer-sized and consist entirely of grains having at least one dimension of less than 500 nm as a result of a sufficient strain deformation, the polycrystalline chips being in the form of particulates, ribbons, wires, filaments and/or platelets;

breaking the polycrystalline chips to form polycrystalline particles having nanocrystalline microstructures; and then consolidating the polycrystalline particles to form a monolithic product with the polycrystalline particles.

19. A method according to claim 18, wherein the body is formed of a material chosen from the group consisting of metal, metal alloy, intermetallic and ceramic materials.

20. A method according to claim 18, wherein the grains of the polycrystalline particles have a nominal size of less than 300 nm.

21. A method according to claim 18, wherein the strain deformation that occurs during the machining step is characterized by a plastic strain of about 0.5 to about 10, and a strain rate of up to $10^6$ per second.

22. A method according to claim 18, wherein the machining step is performed with the cutting tool under conditions including a cutting speed of about 100 to about 200 m/minute, and a depth of cut of about 0.1 to about 0.2 mm.

23. A method according to claim 18, wherein the breaking step comprises comminuting the polycrystalline chips to form the polycrystalline particles, and the product is sintered following the consolidating step.

24. A method according to claim 23, wherein the comminuting, consolidation and/or sintering steps cause grain growth in the polycrystalline particles or the product.

25. A method according to claim 23, wherein the product consists essentially of a nanocrystalline microstructure after the consolidating step.

26. A method of forming a product, the method comprising the steps of:

providing a body with a single-crystal or polycrystalline microstructure that is essentially free of nano-crystals;

machining the body with a wedge-shaped cutting tool to produce polycrystalline chips that are at least micrometer-sized and consist entirely of grains having at least one dimension of less than 500 nm as a result of a sufficient strain deformation, the polycrystalline chips being in the form of particulates, ribbons, wires, filaments and/or platelets;

breaking the polycrystalline chips to form polycrystalline particles having nanocrystalline microstructures; and then forming a product in which at least portions of the polycrystalline particles are dispersed in a matrix material.

27. A method according to claim 26, wherein the body is formed of a material chosen from the group consisting of metal, metal alloy and intermetallic materials.

28. A method according to claim 26, wherein the body is formed of an inorganic material chosen from the group consisting of ceramic materials.

29. A method according to claim 26, wherein the grains of the polycrystalline particles have a nominal size of less than 300 nm.

30. A method according to claim 26, wherein the strain deformation that occurs during the machining step is characterized by a plastic strain of about 0.5 to about 10, and a strain rate of up to $10^6$ per second.

31. A method according to claim 26, wherein the machining step is performed with the cutting tool under conditions including a cutting speed of about 100 to about 200 m/minute, and a depth of cut of about 0.1 to about 0.2 mm.

32. A method according to claim 26, wherein the breaking step comprises comminuting the polycrystalline chips to form the polycrystalline particles.

33. A method according to claim 26, wherein the polycrystalline particles are present in the matrix material in the form of ribbons, wires or filaments.

34. A method according to claim 26, wherein the polycrystalline particles are in the form of ribbons, wires or filaments as a result of the forming step, the breaking step comprising breaking the polycrystalline chips to form platelets prior to dispersing the polycrystalline particles in the matrix material.

35. A method according to claim 26, wherein the matrix material is chosen from the group consisting of metal, metal alloy and intermetallic materials.

36. A method according to claim 26, wherein the matrix material is a polymeric material.

37. A method according to claim 26, wherein the matrix material is an inorganic material chosen from the group consisting of ceramic materials.

38. A method according to claim 26, wherein the portions of the polycrystalline particles in the product consist essentially of nanocrystalline microstructures.

39. A method according to claim 1, wherein the method is part of a manufacturing process in which the machining step also produces a machined product from the body, and the polycrystalline chips are a byproduct of the manufacturing process.

40. A method according to claim 18, wherein the method is part of a manufacturing process in which the machining step also produces a machined product from the body, and the polycrystalline chips are a byproduct of the manufacturing process.

41. A method according to claim 26, wherein the method is part of a manufacturing process in which the machining step also produces a machined product from the body, and the polycrystalline chips are a byproduct of the manufacturing process.

* * * * *